US008519505B2

(12) United States Patent
Hiroshige et al.

(10) Patent No.: US 8,519,505 B2
(45) Date of Patent: Aug. 27, 2013

(54) ELECTRICALLY CONDUCTIVE POLYMER COMPOSITE AND THERMOELECTRIC DEVICE USING ELECTRICALLY CONDUCTIVE POLYMER MATERIAL

(75) Inventors: Yuji Hiroshige, Tokyo (JP); Hidekl Minami, Tokyo (JP); Norihisa Watanabe, Kangawa (JP); Jun Fujita, Tokyo (JP)

(73) Assignee: 3M Innovative Properties Company, St. Paul, MN (US)

( * ) Notice: Subject to any disclaimer, the term of this patent is extended or adjusted under 35 U.S.C. 154(b) by 196 days.

(21) Appl. No.: 13/122,488

(22) PCT Filed: Oct. 19, 2009

(86) PCT No.: PCT/US2009/061121
§ 371 (c)(1),
(2), (4) Date: Apr. 4, 2011

(87) PCT Pub. No.: WO2010/048066
PCT Pub. Date: Apr. 29, 2010

(65) Prior Publication Data
US 2011/0186956 A1    Aug. 4, 2011

(30) Foreign Application Priority Data
Oct. 20, 2008 (JP) ................. 2008-270161

(51) Int. Cl.
*H01L 31/058* (2006.01)
(52) U.S. Cl.
USPC ...... 257/467; 257/40; 257/930; 257/E51.013; 977/937; 136/203

(58) Field of Classification Search
USPC ........... 257/467, 40, 930, E51.013; 977/932; 136/203
See application file for complete search history.

(56) References Cited

U.S. PATENT DOCUMENTS

| 2,973,050 A | 2/1961 | Bennett |
| 5,215,820 A | 6/1993 | Hosokawa |
| 5,973,050 A | 10/1999 | Johnson |
| 7,081,210 B2 | 7/2006 | Hirai |
| 7,189,771 B2 | 3/2007 | Hsu |

(Continued)

FOREIGN PATENT DOCUMENTS

| JP | 06-188464 | 7/1994 |
| JP | 10-074987 | 3/1998 |

(Continued)

OTHER PUBLICATIONS

Fleurial, "Thermal Properties of High Quality Single Crystals of Bismuth Telluride—Part I: Experimental Characterization", Journal of Physics and Chemistry of Solids, 1988, vol. 49, No. 10, pp. 1237-1247.

(Continued)

*Primary Examiner* — Tu-Tu Ho
(74) *Attorney, Agent, or Firm* — Jean A. Lown; Adrian L. Pishko

(57) ABSTRACT

An electrically conductive composite material that includes an electrically conductive polymer, and at least one metal nanoparticle coated with a protective agent, wherein said protective agent includes a compound having a first part that has at least part of the molecular backbone of said electrically conductive polymer and a second part that interacts with said at least one metal nanoparticle.

11 Claims, 3 Drawing Sheets

(56) References Cited

U.S. PATENT DOCUMENTS

| | | |
|---|---|---|
| 7,582,897 B2 | 9/2009 | Hirai |
| 2004/0124504 A1 | 7/2004 | Hsu |
| 2005/0040370 A1 | 2/2005 | Gurin |
| 2006/0102871 A1* | 5/2006 | Wang et al. ............ 252/62.51 R |
| 2008/0265414 A1* | 10/2008 | Ho et al. ........................ 257/741 |
| 2011/0155966 A1 | 6/2011 | Hsu |

FOREIGN PATENT DOCUMENTS

| | | |
|---|---|---|
| JP | 2002/305330 | 10/2002 |
| JP | 2003/133600 | 5/2003 |
| JP | 2003-155355 | 5/2003 |
| JP | 2004/359724 | 12/2004 |
| JP | 2006/186255 | 7/2006 |
| JP | 2006/248959 | 9/2006 |
| JP | 2007-138112 | 6/2007 |
| WO | WO 2007/004033 | 1/2007 |

OTHER PUBLICATIONS

Hiroshige, "Thermoelectric Figure-of-Merit of Iodine-doped Copolymer of Phenylenevinylene with Dialkoxyphenylenevinylene", Synthetic Metals, Jun. 2007, vol. 157, Issues 10-12, pp. 467-474.

Yan, "Thermal Transporting Properties of Electrically Conductive Polyaniline Films as Organic Thermoelectric Materials", Journal of Thermal Analysis and Calorimetry, 2002, vol. 69, No. 3. pp. 881-887.

International Search Report for PCT/US2009/061121, 5 pgs.

\* cited by examiner

ELECTRICALLY CONDUCTIVE POLYMER COMPOSITE AND THERMOELECTRIC DEVICE USING ELECTRICALLY CONDUCTIVE POLYMER MATERIAL

CROSS REFERENCE TO RELATED APPLICATIONS

This application is a national stage filing under 35 U.S.C. 371 of PCT/US2009/061121, filed 19 Oct. 2009, which claims priority to Japanese Application No. 2008-270161 filed 20 Oct. 2008, the disclosure of which is incorporated by reference in its/their entirety herein.

PRIORITY

This application claims priority to Japanese Patent Application No. 2008-270161, filed on Oct. 20, 2008, entitled ELECTRICALLY CONDUCTIVE POLYMER COMPOSITE AND THERMOELECTRIC DEVICE USING ELECTRICALLY CONDUCTIVE POLYMER MATERIAL, the disclosure of which is incorporated herein by reference thereto.

FIELD

The present disclosure relates to a composite material that includes an electrically conductive polymer and a metal nanoparticle; a thermoelectric device including the composite material; and a thermoelectric device including an electrically conductive polymer material.

BACKGROUND

Conventional thermoelectric devices such as thermoelectric generating devices or Peltier cooling devices can be fabricated by forming thermocouples from rigid thermoelectric materials such as bismuth-tellurium and disposing a large number of such thermocouples in parallel in the direction of the heat flow. Usually, the thermoelectric material is a bulk material having a columnar shape with a diameter of several millimeters (mm) or a rectangular shape having one side with a length of several mm. In such devices, the cross-section (which is circular, square, or low oblateness rectangular) is directed perpendicular to the heat flow direction. Recently, attempts have been made to produce such thermoelectric devices using thin film thermoelectric materials.

Thermoelectric devices generate power by having a temperature difference between a hot junction and a cold junction. One method of improving the efficiency therefore is to reduce the heat conducted from the hot junction to the cold junction as much as possible and to create a larger temperature difference between the two junctions. However, in conventional thermoelectric devices, the amount of heat released from the thermoelectric material surface is not sufficiently affected. Furthermore, it is sometimes difficult to maintain a large enough temperature difference between the two junctions.

Japanese Unexamined Patent Publication No. 2003-133600 describes a thermoelectric conversion member that converts heat into electricity by utilizing a temperature difference. The device includes two thin-film thermoelectric device layers, one having a p-type semiconductor and one having an n-type semiconductor. The layers are formed by vapor deposition on a flexible substrate.

Thin film thermoelectric materials can have increased heat release from the surface because of the relative increase in the surface area exposed to the outside. However, since the thermal conductivity of generally used inorganic thermoelectric materials are high (for example, from 1.5 to 2.0 W/(m·K) for a Bi—Te alloy (see, J. P. Fleurial et al., *J. Phys. Chem. Solids,* 49, 1237 (1988)) and 4 W/(m·K) for an Si—Ge alloy (see, *Netsuden Henkan Zairyo* (*Thermoelectric Conversion Material*), Nikkan Kogyo Sha (2005)), a sufficiently large temperature difference between the two junctions often cannot be maintained due to heat transfer from the hot junction to the cold junction.

Even though it has low electrical conductivity (about 200 S/cm), polyaniline is widely used in anti-electrostatic applications because of the ease in handling and processing the polymer. Increasing its electrical conductivity could enhance its usage, for example in thermoelectric devices. One method of increasing its electrical conductivity is by combining it with metal nanoparticles.

Japanese Unexamined Patent Publication No. 2004-359742 describes a noble metal-based catalyst-supported electrically conductive composite material produced by performing a polymerization reaction of an electrically conductive polymer using a noble metal complex as an oxidizing agent. The polymerization simultaneously loads the noble metal-based complex into the polymer while reducing the noble metal-based catalyst.

Japanese Unexamined Patent Publication No. 2006-248959 discloses a π-conjugated molecular compound-metal nanocluster that includes a π-conjugated molecular compound with metal or metal oxide fine particles dispersed therein. The nanoclusters are produced by mixing a metal salt and a π-conjugated molecular compound in a solvent and adding sodium borohydride as a reducing agent.

There still remains a need for electrically conductive polymers that include metal nanoparticles having higher electrical conductivities and increased compatibility and/or ease of dispersion of the metal nanoparticle.

SUMMARY

Disclosed is an electrically conductive composite material that includes an electrically conductive polymer and at least one metal nanoparticle coated with a protective agent. The protective agent includes a compound having a first part that has at least part of a molecular backbone of said electrically conductive polymer and a second part that interacts with said at least one metal nanoparticle.

Also disclosed is a thermoelectric device that include a heat resistance substrate; a first thermoelectric material including an electrically conductive composite material, wherein the first thermoelectric material is disposed in a thin film on said substrate; a second thermoelectric material including an n-type semiconductor or a metal, wherein the second thermoelectric material is disposed in a thin film or wire shape on said substrate, wherein the second thermoelectric material is adjacent to and spaced apart from said first thermoelectric material and wherein said first and second thermoelectric materials together constitute a unit thermocouple; and an electrically conductive material that electrically connects an end part of said first thermoelectric material and an end part of said second thermoelectric material, thereby forming a circuit wherein said first thermoelectric material and said second thermoelectric material are alternately electrically connected in series and both ends of the circuit are opened. The electrically conductive composite material in the first thermoelectric material includes an electrically conductive polymer and at least one metal nanoparticle coated with a protective agent. The protective agent includes a compound having a first part that has at least part of a molecular backbone of said electrically conductive polymer and a second part that interacts with said at least one metal nanoparticle.

Also disclosed is a thermoelectric device that includes a heat resistant substrate; a first thermoelectric material including an electrically conductive polymer, wherein the first thermoelectric material is disposed in a thin film on said substrate; a second thermoelectric material including an n-type semiconductor or a metal, wherein the second thermoelectric material is disposed in a thin film or wire shape on said substrate, wherein the second thermoelectric material is adjacent to and spaced apart from said first thermoelectric material and wherein said first and second thermoelectric materials together constitute a unit thermocouple; and an electrically conductive material that electrically connects an end part of said first thermoelectric material and an end part of said second thermoelectric material, thereby forming a circuit wherein said first thermoelectric material and said second thermoelectric material are alternately electrically connected in series and both ends of the circuit are opened.

DETAILED DESCRIPTION

Figure 1:
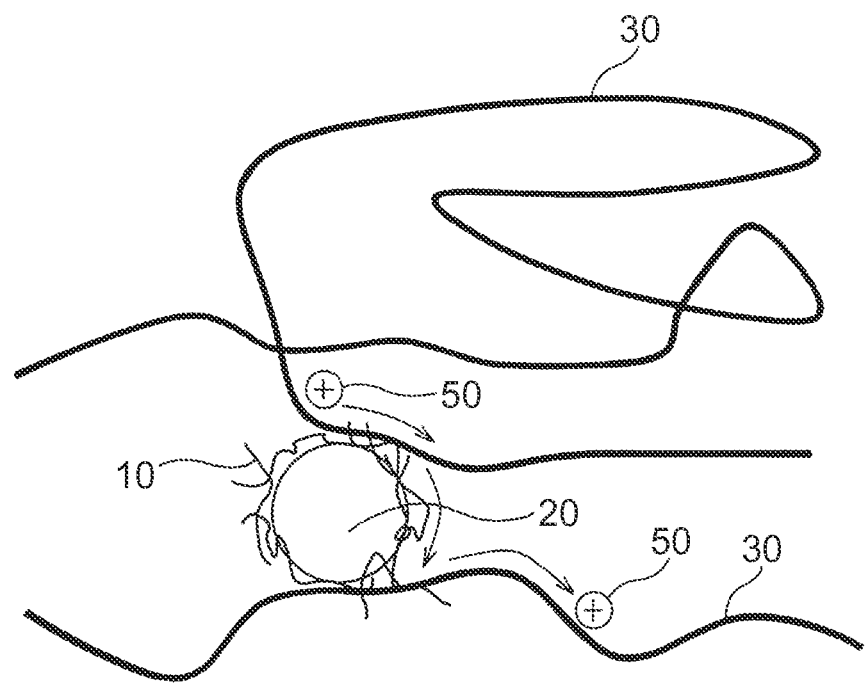
FIG. 1 is a schematic depiction of an exemplary mechanism that could account for the carrier transfer in disclosed composite material.

Disclosed herein is an electrically conductive composite material that includes an electrically conductive polymer and metal nanoparticles. The metal nanoparticles are coated with a protective agent. The protective agent is a compound having a first part that has at least part of a molecular backbone of the electrically conductive polymer and a second part that interacts with the metal nanoparticle.

Disclosed electrically conductive composite materials can have greatly increased electrical conductivity as compared with an electrically conductive polymer alone, compared with a mixture of an electrically conductive polymer and a metal nanoparticle without a protective agent, or compared with a mixture of an electrically conductive polymer and a metal nanoparticle with a conventional protective agent that does not include both a first part that has at least part of a molecular backbone of the electrically conductive polymer and a second part that interacts with the metal nanoparticle. Thermoelectric devices can have increased thermoelectric conversion efficiency by creating a larger temperature difference between two junctions.

Various polymers can be used as the electrically conductive polymer, including for example, polyacetylene, polyaniline, polythiophene, polypyrrole, polyphenylenevinylene, polythienylenevinylene, derivatives thereof, or the like. Electrically conductive polymers may include substituents introduced into the molecular backbone of such an electrically conductive polymer. The particular polymer can be chosen based on practical considerations such as, for example, ease of film formation and stability in the air. In some embodiments, the electrically conductive polymer can include polyaniline, or derivatives thereof.

Electrically conductive polymers that can be utilized herein can exhibit electrical conductivity by insulator-metal transition through doping. The electrically conductive polymers can be doped with n-type semiconductors or n-type semiconductors.

When doping with a p-type semiconductor, a π-electron is removed from the conjugated system of the electrically conductive polymer by using a dopant called an acceptor. By doing so, a hole is created that can allow movement along the main chain. Examples of acceptor dopants can include halogens, Lewis acids, protonic acids, and transition metal halides. Protonic acids are often used as the acceptor dopant. Examples of such protonic acids include organic acids such as p-toluenesulfonic acid, camphorsulfonic acid and formic acid; and inorganic protonic acids such as hydrochloric acid, sulfuric acid, nitric acid and phosphoric acid. In the case of polyaniline, a semiquinone radical can be produced by doping with protonic acids lacking oxidative ability (such as hydrochloric acid). The polyaniline will therefore exhibit electrical conductivity.

When doping with an n-type semiconductor, an electron is donated to the conjugated system of the electrically conductive polymer by using a dopant called a donor. When doing so, an electron can move along the main chain. Examples of donor dopants can include alkali metals and alkylammonium ions.

The protective agent (which can also be referred to as a modifier or a capping agent) is a compound having a first part that has at least a part of the molecular backbone of the electrically conductive polymer and a second part that interacts with the metal nanoparticle. When the protective agent is coated on the metal nanoparticle surface, the first part can contribute to an increase in the compatibility or dispersability of the metal nanoparticle in the electrically conductive polymer. The protective agent can also interact with metal ions (a precursor of the metal nanoparticle) which can then be reduced to form the metal nanoparticle. The protective agent can provide a reaction site for reduction and may affect the size of a metal particle growing at a reduction site.

The expression "at least a part of the molecular backbone of the electrically conductive polymer" refers to at least a part of the characteristic structure indispensable for constituting the polymer. For example, in the case where the electrically conductive polymer is polyaniline, "at least a part of the molecular backbone of the electrically conductive polymer" refers to at least a part of the polyaniline chain, for example, an aminophenyl moiety and a plurality of aminophenyl moieties polymerized together. In the case of polyaniline, the phrase "at least a part of the molecular backbone of the electrically conductive polymer", would also include polyaniline with introduced substituents, chain ending groups, or the like. The same applies to electrically conductive polymers other than polyaniline. For example, in embodiments where the electrically conductive polymer is polythiophene, the phrase "at least a part of the molecular backbone of the electrically conductive polymer" includes a thiophene moiety and a plurality of thiophene moieties polymerized together. In embodiments where the electrically conductive polymer is polyphenylenevinylene the phrase "at least a part of the molecular backbone of the electrically conductive polymer" includes a phenyl moiety, a vinylbenzene moiety, and a plurality of phenyl and/or vinylbenzene structures polymerized together.

The second part of the protective agent is one that interacts with the metal nanoparticle. This portion can be capable of forming a coordinate bond, an ionic bond, or the like, to a metal of the metal nanoparticle. Examples of such second parts include for example, a functional group having a coordinating property to a metal, such as a hydroxyl group, a carboxyl group, a sulfonic acid group, an acetylacetonate group, a halogen group, a nitrile group, a pyrrolidone group, an amino group, an amide group or a thiol group.

Exemplary compounds that can be utilized as the protective agent when the electrically conductive polymer is polyaniline include, but are not limited to 4-aminothiophenol, 2-aminothiophenol, 3-aminothiophenol, 2-aminobenzenesulfonic acid, 2-aminobenzoic acid, 3-aminobenzoic acid, 4-aminobenzoic acid, 2-aminobenzonitrile, 3-aminobenzonitrile, 4-aminobenzonitrile, 2-aminobenzyl cyanide, 3-aminobenzyl cyanide, 4-aminobenzyl cyanide, N-phenyl-1,2-phenylenediamine, and N-phenyl-1,4-phenylenediamine. Exemplary compounds that can be utilized as the protective agent when the electrically conductive polymer is polythiophene or polythienylenevinylene include, but are not limited to, 3-(2-thienyl)-DL-alanine, 4-(2-thienyl)butyric acid, 2-(2-thienyl)ethanol, 2-(3-thienyl)ethanol, 2-thiopheneacetic acid, 3-thiopheneacetic acid, 2-thiopheneacetonitrile, 2-thiophenecarbonitrile, 2-thiophenecarboxamide, 2-thiophenecarboxylic acid, 3-thiophenecarboxylic acid, 2-thiophenecarboxylic acid hydrazide, 2,5-thiophenedicarboxylic acid, 2-thiopheneethylamine, 2-thiopheneglyoxylic acid, 2-thiophenemalonic acid, 2-thiophenemethanol or 3-thiophenemethanol. Exemplary compounds that can be utilized as the protective agent when the electrically conductive polymer is polypyrrole include, but are not limited to, pyrrole-2-carboxylic acid and 1-(2-cyanoethyl)pyrrole. Exemplary compounds that can be utilized as the protective agent when the electrically conductive polymer is polyphenylenevinylene include, but are not limited to benzoic acid, benzenethiol, benzenesulfonic acid, 3-vinylbenzoic acid and 4-vinylbenzoic acid.

The protective agent may contain a copolymer of a monomer having at least a part of the molecular backbone of the electrically conductive polymer and a monomer having a portion that interacts with the metal nanoparticle. For example, when polyaniline is the electrically conductive polymer, the protective agent may be a copolymer of N-vinylpyrrolidone (having a pyrrolidone capable of interacting with the metal nanoparticle) and N-phenyl-N'-(3-methacryloyloxy-2-hydroxypropyl)-p-phenylenediamine (having the structure of two aniline moieties).

The metal nanoparticle can be obtained by reducing a metal ion in the presence of the protective agent. The metal ion can be reduced by, for example, using a reducing agent such as sodium tetrahydroborate or hydrazine, or an alcohol reduction method. In such embodiments, the particle diameter of the metal nanoparticles can be from about 1 to about 100 nm.

The ratio of the number of moles of protective agent to the number of moles of the metal nanoparticle may be about 0.1 or more. When the mole ratio of protective agent to metal nanoparticles is about 0.1 or more, the metal nanoparticles are generally sufficiently stably dispersed in the medium (either the reaction mixture and/or the obtained electrically conductive composite material). The mole ratio can be about 0.5 or more, about 1 or more, about 2 or more, or about 5 or more. The ratio of the number of moles of protective agent to the number of moles of the metal nanoparticle may be about 50 or less. When the mole ratio of protective agent to metal nanoparticles is about 50 or less, the electrical interaction between the metal nanoparticles and the electrically conductive polymer is not inhibited and the electrical conductivity of the electrically conductive composite material can be enhanced as compared with the electrically conductive polymer alone. The mole ratio can be about 40 or less, about 30 or less, about 20 or less, or about 10 or less.

The metal nanoparticles can include simple metals such as gold, platinum, palladium, silver, rhodium, nickel, copper and tin, or an alloy of two or more such metals. In embodiments, a metal nanoparticle of gold, platinum, palladium or silver can be used. In embodiments, gold, platinum or palladium can be used because of their relatively high oxidation resistance.

The metal nanoparticles coated with protective agent and the electrically conductive polymer are physically mixed (for example, with a solvent) to form an electrically conductive composite material. Alternatively, the metal nanoparticles coated with the protective agent can be mixed in a reaction system containing the electrically conductive polymer during polymerization of the electrically conductive polymer. In such an embodiment, polymerization of the electrically conductive polymer and mixing of the electrically conductive polymer and the metal nanoparticles can be simultaneously accomplished. Doping of the electrically conductive polymer may be performed before mixing the metal nanoparticle or may be performed simultaneously with the mixing of the metal nanoparticle.

In embodiments, the electrically conductive polymer can include about 0.01 wt % or more of metal nanoparticles based on the weight of the electrically conductive polymer. In embodiments where the metal nanoparticle content is about 0.01 wt % or more (based on the weight of the electrically conductive polymer), the electrical conductivity of the electrically conductive composite material can be enhanced. The electrically conductive polymer can include about 0.05 wt % or more, about 0.1 wt % or more, about 0.5 wt % or more, about 1 wt % or more, about 2 wt % or more, or about 5 wt % or more of metal nanoparticles based on the weight of the electrically conductive polymer. The electrically conductive polymer can include up to about 95 wt %, up to about 90 wt %, up to about 85 wt %, up to about 80 wt %, or up to about 75 wt % of metal nanoparticles based on the weight of electrically conductive polymer. In embodiments where the electrically conductive composite material is to be used as a p-type thermoelectric material, the electrically conductive composite material may be about 30 vol % or less of metal nanoparticles. For example the electrically conductive composite material may be about 25 vol % or less, about 20 vol % or less, or about 10 vol % or less of metal nanoparticles. The electrically conductive composite material typically includes at least about 0.01 vol %, at least about 0.05 vol %, at least about 0.1 vol %, at least about 0.3 vol %, at least about 0.5 vol %, at least about 0.8 vol %, or at least about 1 vol % of metal nanoparticles.

The Seebeck coefficient of a metal is generally low and therefore, addition of the metal nanoparticle in relatively large amounts can lead to a reduction of the Seebeck coefficient of the electrically conductive composite material. However, when the metal nanoparticles are utilized in amounts as described herein, the reduction of the Seebeck coefficient of the electrically conductive polymer can be minimized in order to still increase the electrical conductivity.

Disclosed electrically conductive composite materials can be utilized in various shapes. For example, an electrically conductive composite material film may be formed by dissolving the electrically conductive composite material in m-cresol or the like, applying the solution onto a substrate such as a glass substrate or polymer film (by methods such as bar coating, screen printing or spin coating) and drying the coating. A plurality of the films may be stacked. Alternatively, the film may be stretched to align the orientation of the electrically conductive polymer and thereby further increase the electrical conductivity.

FIG. 1 Shows a mechanistic explanation for electrically conductive polymers composites with the protective agent that includes both a first part that has at least part of the molecular backbone of the electrically conductive polymer and a second part that interacts with the at least one metal nanoparticle. Although not wishing to be bound by theory, a possible mechanistic explanation for the increase in the electrical conductivity of disclosed electrically conductive composite materials is depicted in FIG. 1.

Figure 2:
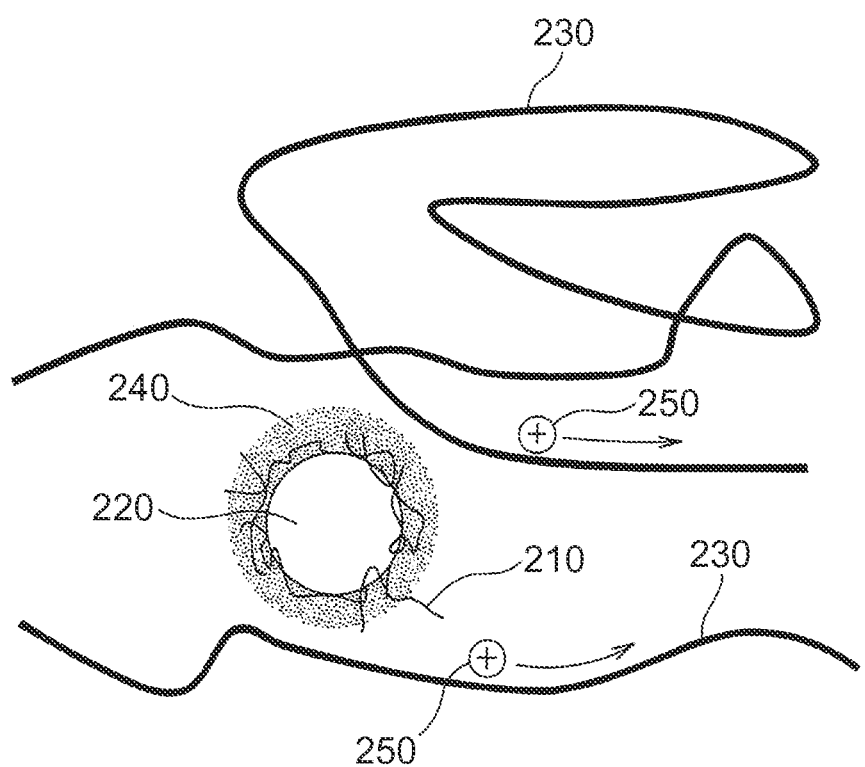
FIG. 2 is a schematic depiction of an exemplary mechanism that could account for the carrier transfer in a composite material with a conventional protective agent.

Electrical conductivity is typically greatly affected by carrier transfer (carrier hopping) between molecular chains of the electrically conductive polymer. Conventionally employed protective agents (i.e., protective agents without a first part that has at least part of the molecular backbone of the electrically conductive polymer but with a second part that interacts with the at least one metal nanoparticle) are generally insulating organic compounds, which in many cases are not very compatible with electrically conductive polymers. FIG. 2 illustrates the mechanism for a conventional protective agent. As shown in FIG. 2, even when a metal nanoparticle 220 coated with a conventional protective agent 210 is dispersed in an electrically conductive polymer 230 an insulating region 240 is formed on the metal nanoparticle 220 surface. This inhibits carrier transfer (carrier hopping) of a positive charge 250 flowing in the electrically conductive polymer 230 to another electrically conductive polymer 230 through the surface or bulk of the metal nanoparticle 220.

On the other hand, protective agents as disclosed herein include a first part that includes at least a part of the molecular backbone of the electrically conductive polymer and therefore, are highly compatible with the electrically conductive polymer. FIG. 1 shows that by virtue of this compatibility, the disclosed protective agent 10 can attract molecular chains of two or more electrically conductive polymers 30 to the metal nanoparticle 20 thereby allowing the molecular chains to come close together. As shown by the arrow in FIG. 1, a positive charge 50, flowing in the electrically conductive polymer 30, is encouraged to undergo carrier transfer through the surface or bulk of the metal nanoparticle 20 or can undergo direct carrier transfer between two spatially close molecular chains. As a result of such a mechanism, the electrical conductivity of the electrically conductive composite material can be increased.

The disclosed electrically conductive composite materials can be utilized in various electric/electronic applications. Specific examples of applications include anti-electrostatic technology, anti-electromagnetic wave technology, electrical connection technology, capacitors, secondary batteries and actuators.

Disclosed electrically conductive composite materials that are p-type thermoelectric materials can be used for thermoelectric generation utilizing waste heat of a factory, an incinerator or the like, or waste heat of electrical equipment. Disclosed p-type electrically conductive composite materials can also be used as temperature sensors or thermoelectric cooling devices (Peltier device).

Disclosed herein are thermoelectric devices that include (a) a heat resistant substrate, (b) a first thermoelectric material that includes an electrically conductive polymer, wherein the first thermoelectric material is disposed in a thin film on the substrate, (c) a second thermoelectric material that includes an n-type semiconductor or a metal, wherein the second thermoelectric material is disposed in a thin film or wire shape on the substrate, wherein the thin film or wire shape is adjacent to and spaced apart from the first thermoelectric material, and wherein the first and second thermoelectric materials together constitute a unit thermocouple together, and (d) an electrically conductive material that electrically connects an end part of the first thermoelectric material and an end part of the second thermoelectric material forming a circuit where the first thermoelectric material and the second thermoelectric material are alternately electrically connected in series and both ends of the circuit are opened. In some embodiments, the first thermoelectric material includes a composite material that includes both an electrically conductive polymer and at least one metal nanoparticle coated with a protective agent. The protective agent includes a compound having a first part that has at least part of a molecular backbone of said electrically conductive polymer and a second part that interacts with said at least one metal nanoparticle.

In embodiments, the first thermoelectric material can be disposed in a thin film, so that the surface area exposed to the external environment of the thermoelectric device can be made relatively large. The thermal conductivity of the electrically conductive polymer in the first thermoelectric material is lower than that of conventional inorganic thermoelectric materials. Because of this, heat conducted from a hot junction to a cold junction can be efficiently dissipated to the external environment between those junctions and the temperature difference between the two junctions can be maintained. This can increase the thermoelectric conversion efficiency of the thermoelectric device.

The heat resistant substrate can be any substrate that does not deform or collapse at the operating temperatures of the thermoelectric device. Generally, the operating temperature of the thermoelectric device is not more than about 200° C. The substrate can either be an insulating material or an electroconductive material. In embodiments where an electroconductive material is used, an insulating film can be provided on the surface to avoid electrical contact between the substrate and the thermoelectric material. The shape, size, and the like of the substrate are not particularly limited. In embodiments, the substrate may be rectangular or square so that the devices can be easily arranged. In embodiments where the substrate is a square or rectangle, the substrate may have a length of about 10 to about 1,000 mm and a width of about 10 to about 1,000 mm.

In embodiments where it is desired that the device be flexible, flexible polymer films such as polyimide or polyethylene terephthalate can be used as the substrate. In such embodiments, the flexible substrate may have a thickness of about 5 μm or more; in embodiments about 10 micrometers (μm) or more. Flexible substrates having a thickness of about 5 μm or more are generally sufficiently strong. The flexible substrate may have a thickness of about 2 mm or less; or in embodiments about 1 mm or less. Flexible substrates having thicknesses of about 2 mm or less provide sufficient flexibility to allow bending or deforming of the device. Such flexibility can allow the device to be bent or deformed so as to fit a limited installation space. Such flexibility can further enhance the heat release by affording appropriate arrangement of a hot junction and/or a cold junction. A flexible thermoelectric device can also be contacted with a heat source having a curved surface by allowing the device shape to conform to the curved surface, this can minimize the heat transfer loss between the heat source and the thermoelectric device.

The first thermoelectric material contains an electrically conductive polymer and is disposed in a thin film on the substrate. The thin film enables efficient heat release from the surface of the thermoelectric material. Various polymers can be utilized as the thermoelectric materials, including polyacetylene, polyaniline, polythiophene, polypyrrole, polyphenylenevinylene, polythienylenevinylene, derivatives thereof, and the like. In embodiments, polyaniline, polythiophene, polypyrrole, polyphenylenevinylene, polythienylenevinylene, derivatives thereof, and the like can be used due to their ease of film formation and air stability. In embodiments, polyaniline can be used.

Polyaniline generally has a thermal conductivity from 0.02 to 0.24 W/(m·K) (27° C.) (see, H. Yan, et al., *J. Therm. Anal. Cal.*, 69, 881 (2002)) and polyphenylenevinylene generally has a thermal conductivity from 0.05 to 0.16 W/(m·K) (25° C.) (see, Y. Hiroshige, et al., *Synth. Met.*, 157, 467 (2007)). As seen from these values, the thermal conductivity of the electrically conductive polymer is from approximately 1/10 to 1/100 of that of conventional thermoelectric materials and therefore, the heat conducted from a hot junction to a cold junction without dissipating from the surface can be greatly reduced.

The electrical conductivity of the first thermoelectric material may be enhanced by using an electrically conductive composite material as disclosed herein as the first thermoelectric material. As disclosed above, an electrically conductive composite material includes an electrically conductive polymer in combination with a metal nanoparticle. The metal nanoparticle can be coated with a protective agent, which is a compound having a first part that is at least a part of the molecular backbone of the electrically conductive polymer and a second part that interacts with the metal nanoparticle. Use of even a small amount of such a protective agent coated nanoparticle can greatly increase the electrical conductivity while at the same time minimizing the reduction in the Seebeck coefficient. This can lead to increased thermoelectric conversion efficiency for a thermoelectric device as disclosed.

In embodiments, a first thermoelectric material can have a ratio of oblateness of the cross section (length of the long side of cross-section/film thickness) perpendicular to the direction of heat flow (direction running from a hot junction toward a cold junction) of the thermoelectric device of about 5 or more; and in embodiments of about 10 or more. For example, assuming that the ratio of oblateness is 10, the surface area of the thermoelectric material becomes about 4 times or more than the surface area of a thermoelectric material having the same cross-sectional area with a circular or square cross-section. Therefore, by setting the ratio of oblateness to be about 5 or more, the surface area exposed to the external environment of the first thermoelectric material can be made sufficiently large, which can efficiently dissipate heat conducted from a hot junction to a cold junction from the surface of the first thermoelectric material to the external environment.

In embodiments where a flexible substrate is utilized, the thickness of the first thermoelectric material may be about 1 μm or more; and in embodiments, about 5 μm or more. When the thickness of the first thermoelectric material is about 1 μm or more, breaking of the thermoelectric material by bending or deformation of the thermoelectric device can be prevented. In embodiments where a flexible substrate is utilized, the thickness of the first thermoelectric material may be about 10 mm or less; and in embodiments about 5 mm or less. When the thickness of the first thermoelectric material is about 10 mm or less, sufficient flexibility can be imparted to the thermoelectric device.

The first thermoelectric material can have various shapes, including a strip, a rectangle, or a square. The length along the heat flow direction of the first thermoelectric material may be selected depending on the dimensions of the substrate, the shape of the substrate, and the like. In embodiments, the length along the heat flow direction of the first thermoelectric material may be from about 10 to about 1,000 mm.

The second thermoelectric material is disposed on the substrate adjacent to and spaced apart from the first thermoelectric material. The first and second thermoelectric materials together constitute a unit thermocouple. The second thermoelectric material includes an n-type semiconductor or metal. Generally, n-type semiconductors or metals that are employed in general thermoelectric devices can be used. Examples of n-type semiconductors or metals include alloy-based thermoelectric materials (such as scutterdite compounds, silicide-based compounds, half-heusler metals and boron compounds), oxide-based thermoelectric compounds (such as zinc oxide compounds, titanium oxide compounds and nickel oxide compounds), and metals (such as copper, nickel and platinum).

The second thermoelectric material is disposed in a thin film or wire shape on the substrate. In embodiments where the second thermoelectric material is a thin film, the oblateness, thickness, shape and length along the heat flow direction of the second thermoelectric material may be the same as those of the first thermoelectric material or may be different. The oblateness, thickness, shape, and length may be chosen based on the arrangement pattern of unit thermocouples, the electric conductivity, the Seebeck coefficient, the thermal conductivity, and the like of the second thermoelectric material. A thin film of a second thermoelectric material may be, for example, formed by vapor deposition, may be a foil, or may be a film formed by dispersing the above-described n-type semiconductor or metal in a resin. In embodiments where the second thermoelectric material is in the shape of a wire, the second thermoelectric material may be disposed such that the entire wire is in contact with the substrate or the wire contacts the substrate only at a portion that is electrically connected to the first thermoelectric material. The length and diameter (or cross-sectional area) of the wire can be chosen based on the arrangement pattern of unit thermocouples, and the electric conductivity, Seebeck coefficient, thermal conductivity and the like of the second thermoelectric material.

The thickness of the second thermoelectric material may be chosen so that it does not impair the flexibility of the thermoelectric device. In embodiments that utilize an n-type semiconductor in a thin film as the second thermoelectric material, the thickness thereof may be about 0.5 mm or less. In embodiments that utilize a metal in a thin film as the second thermoelectric material, the thickness thereof may be about 1 mm or less. In embodiments where the second thermoelectric material includes a metal, and is in the form of a wire, the diameter thereof may be about 1 mm or less. In embodiments where the second thermoelectric material is a film including a resin having an n-type semiconductor or a metal dispersed therein, the thickness can be increased due to the flexibility of the resin.

An end part of the first thermoelectric material and an end part of the second thermoelectric material in proximity thereto are electrically connected to form a unit thermocouple with the remaining two end parts being unconnected. In embodiments where one unit thermocouple is contained in a thermoelectric device, the unit thermocouple can be regarded as a simple circuit where the first thermoelectric material and the second thermoelectric material are electrically connected in series and the remaining two end parts are opened as a terminal. The electrical connection between the end parts of the first and second thermoelectric materials may be performed using an electrically conductive material such as solder, electrically conductive paste or anisotropic electrically conductive film. Before performing the electrical connection by using such an electrically conductive material, a metal thin-film layer may be provided on the connection portion of the first thermoelectric material and/or the second thermoelectric material to reduce the electrical contact resistance between the electrically conductive material and the thermoelectric material. The optional metal thin film layer may be formed by sputtering, vapor deposition, or the like.

In embodiments where a plurality of unit thermocouples are disposed on the substrate, a single unit thermocouple has the unconnected end part of a first thermoelectric material electrically connected to the unconnected end part of a second thermoelectric material of an adjacent unit thermocouple; and the unconnected end part of a second thermoelectric material is electrically connected to the end part of a first thermoelectric material of a second adjacent unit thermocouple. In this way, a circuit is formed on the substrate, where a first thermoelectric material and a second thermoelectric material are alternately electrically connected in series and both ends of the circuit are opened. Electrical connection of a plurality of unit thermocouples can be performed using the above-described electrically conductive material.

A stacked thermoelectric device can also be formed. A stacked thermoelectric device can be formed by stacking a plurality of substrates, each substrate having disposed thereon one unit thermocouple or a plurality of unit thermocouples. Stacked thermoelectric devices can be advantageous when a high output voltage is required. Electrical connection between two unit thermocouples on separate substrates may be performed using copper wire in combination with the above-described electrically conductive material or may be performed through a connection pattern previously formed on the substrate, such as a circuit pattern formed on a substrate by using a resist and plating.

In embodiments, a material having high thermal conductivity may be provided on the joint portion of the first and second thermoelectric materials to cover the joint portion. This can provide better contact with the heat source. In embodiments, a protective film may be provided on the surface of the device. This can provide mechanical protection or reinforcement of the thermoelectric material surface, rust prevention, insulation assurance, or the like.

Figure 3:
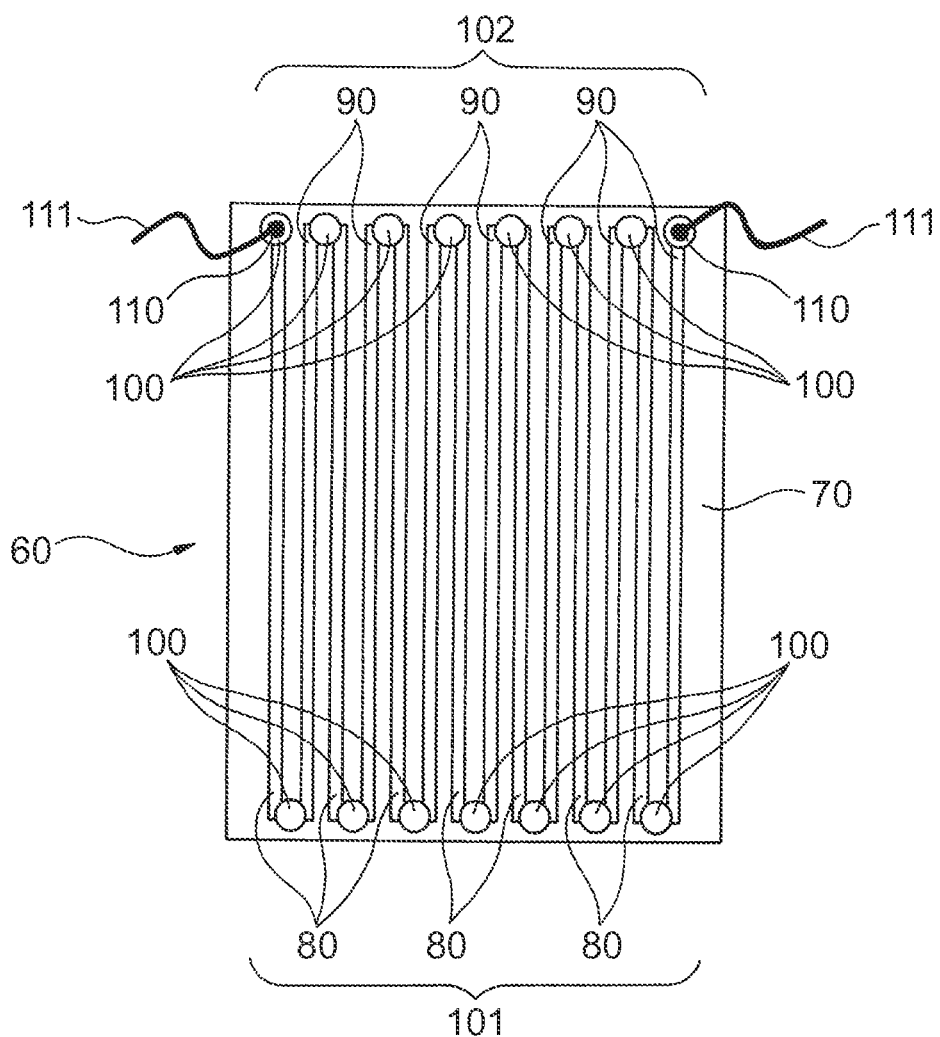
FIG. 3 is a schematic depiction of an exemplary thermoelectric device.

FIG. 3 shows a thermoelectric device 60 that includes a substrate 70. Positioned on the substrate 70, is a first thermoelectric material 80 disposed as a strip-like thin film, a second thermoelectric material 90 disposed as a strip-like thin film adjacent to and spaced apart from the first thermoelectric material 80, an electrically conductive material 100 alternately electrically connects the first and second thermoelectric materials in series, and a lead wire 111 connected to each of two terminals 110 of the formed circuit.

To fabricate such a device, the first thermoelectric material 80 can be dispersed or dissolved in a solvent, and the liquid dispersion or solution can be applied to the substrate 70 (by for example bar coating, screen printing, spin coating or ink jetting), and then dried to form a thin film. During the coating, a masking tape or the like may be used to prevent the first thermoelectric material 80 from being applied to an unnecessary portion of the substrate. In the case of using screen printing, inkjet printing or the like, the first thermoelectric material 80 can be applied in the desired shape or pattern (in FIG. 3, a strip-like shape) directly on the substrate 70. In order to increase the adherence between the first thermoelectric material 80 and the substrate 70, the surface of the substrate 70 may be subjected to physical surface modification such as plasma treatment, flame treatment, electron beam treatment and corona treatment, or chemical surface modification using a coupling agent or the like. In other embodiments, a thin film of the first thermoelectric material 80 can be separately produced and then cut into a desired shape (for example a strip-like shape). This thin film can then be disposed on the substrate 70 by using an adhesive or the like. In embodiments where the substrate 70 is an adhesive tape, the thin film may be attached directly to the adhesive surface thereof.

The second thermoelectric material 90 can be disposed as a strip-like thin film directly on the substrate 70 by using a mask with a vapor phase process (such as sputtering or vapor deposition). Similar to the first thermoelectric material 80, a strip-like thin film or linear form such as wire of the second thermoelectric material 90 may be separately produced and then disposed on the substrate 70 by using an adhesive or the like.

Electrical connection in a single unit thermocouple or between unit thermocouples may be established using an electrically conductive material 100 such as solder, electrically conductive paste or anisotropic electrically conductive film. Soldering using flux, coating of an electrically conductive paste, or application of an anisotropic electrically conductive film in an appropriate size on the connection portion can all accomplish electrical connection. Some of these electrical connection portions, a group of junctions 101 (arranged on one side, in FIG. 3, the bottom side of the thermoelectric device 60) can be used as hot junctions and some of the others, a group of junctions 102 (arranged on the opposite side, in FIG. 3, the top side of the thermoelectric device 60), can be used as cold junctions, or vice versa.

To each of the terminals 110 of the thermoelectric device 60 thus-obtained, a lead wire 111 for connection to an external circuit may be attached using the above-described solder, electrically conductive paste or the like.

Figure 4:
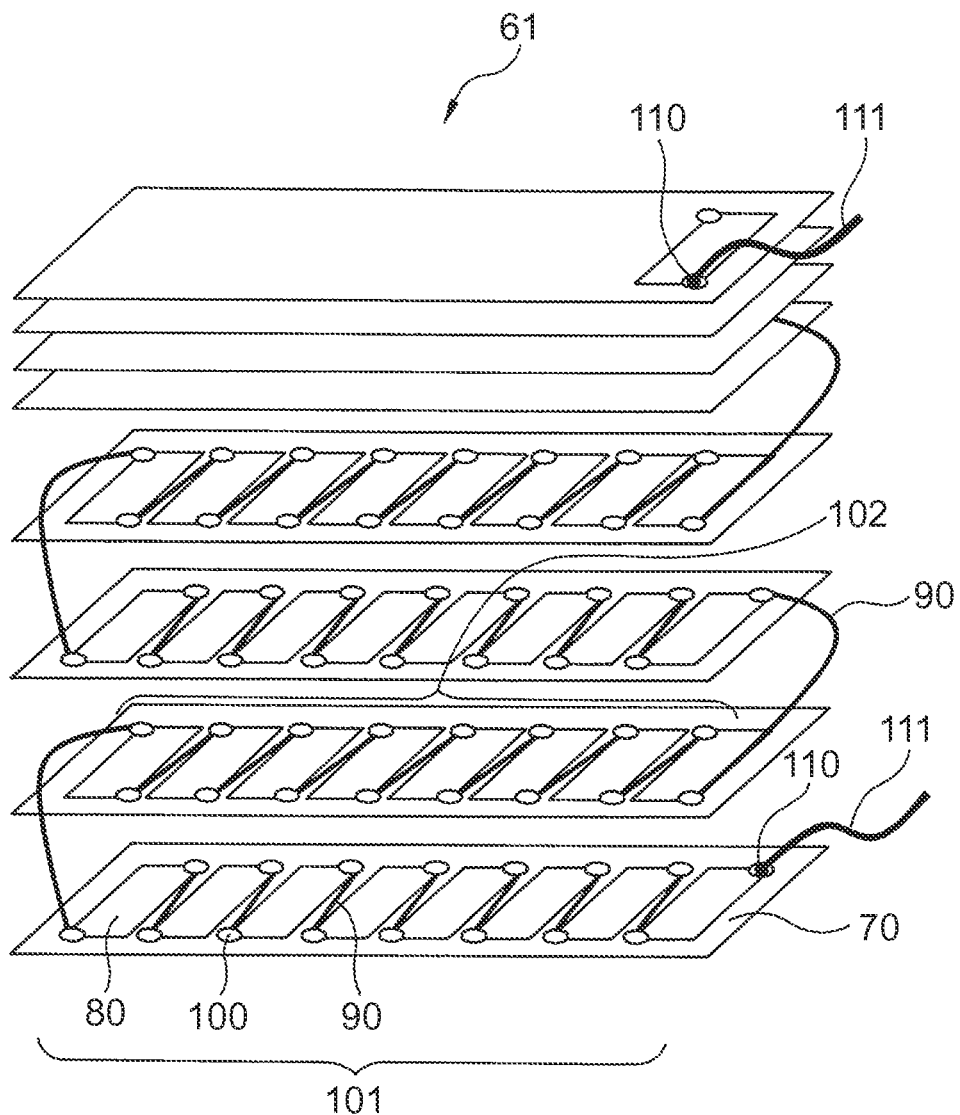
FIG. 4 is a schematic exploded depiction of a disclosed stacked thermoelectric device.

The stacked thermoelectric device 61 schematically shown in an exploded perspective view in FIG. 4 includes, on a substrate 70, a first thermoelectric material 80 that is provided as a rectangular thin film and a wire-shaped second thermoelectric material 90 electrically connected to the end part of the first thermoelectric material by an electrically conductive material 100. A lead wire 111 is attached to each of the terminals 110 present on the outermost and lowermost layers of the stacked thermoelectric device 61. For the sake of simplicity in FIG. 4, all constituent elements are not labeled with a reference numeral.

The first thermoelectric material 80 can be disposed in the same manner as in the thermoelectric device depicted in FIG. 3. In the embodiment depicted in FIG. 4, a wire-shaped second thermoelectric material 90 such as copper wire is bonded to two end parts at diagonal corners of the first thermoelectric material 80 by using an electrically conductive material 100 such as electrically conductive paste. A plurality of unit thermocouples can be formed with first thermoelectric materials 80 and second thermoelectric materials 90 alternately electrically connected in series. Electrical connection between a certain layer and the underlying layer can be performed at the same time as the formation of a unit thermocouple by disposing the second thermoelectric material 90 across those two layers. Similarly to FIG. 3, a group of junctions 101 arranged on one side (in FIG. 4, the front side) of the stacked thermoelectric device 61 can be used as hot junctions, and a group of junctions 102 arranged on the opposite side (in FIG. 4, the back side) can be used as cold junctions, or vice versa.

Disclosed thermoelectric devices can be used for power generation utilizing a temperature difference, for example, for thermoelectric generation utilizing waste heat of a factory, an incinerator or the like or waste heat of electrical equipment. In general, disclosed thermoelectric devices generate electricity by contacting the electrical connection portion(s) (hot junction) on one side with a high-temperature heat source and contacting the electrical connection portion(s) (cold junction) on the opposite side with a low-temperature heat source. Disclosed thermoelectric devices can release high levels of heat from the surface of the device and only conduct small quantities of heat from a hot junction to a cold junction and therefore can maintain a large temperature difference between the hot junction and the cold junction. Therefore, depending on the usage, sufficient thermoelectric conversion can be performed even though the cold junction is not in contact with a low-temperature heat source.

Disclosed thermoelectric devices can also be used as thermoelectric cooling devices (Peltier devices) where the high-temperature portion is cooled by passing electricity to the thermoelectric device while the hot and cold junctions are in contact with a high-temperature portion and a low-temperature portion, respectively.

EXAMPLES

Representative Examples are described in detail below, but it will be apparent to one skilled in the art that changes and modifications can be made in the following embodiments within the scope of the present disclosure.

All chemicals were obtained from Wako Pure Chemical Industries, Ltd. (Osaka, Japan) unless indicated otherwise.

Example 1

(1) Synthesis of Gold Nanoparticle

A gold nanoparticle having p-aminothiophenol (p-ATP) as a protective agent was synthesized as follows. A 1.0 mM ethanol/water (volume ratio=1:1) solution of p-ATP was prepared. This solution was placed in a nitrogen atmosphere and tetrachloroauric(III) acid tetrahydrate was added to the solution to give a tetrachloroauric(III) acid concentration of 1.0 mM. The solution had a mole ratio of p-ATP to gold ion ($Au^{3+}$) of 1:1. The solution was stirred (in the nitrogen atmosphere) while shielding it from light and was then subjected to reduction of the gold ions by drop wise addition of an aqueous solution of sodium tetrahydroborate as a reducing agent. This caused the solution to turn black. This solution was dried, washed with water and then dried again to obtain a black powder. X-ray diffraction measurements of the black powder showed a peak attributable to crystalline gold. From the shape of the peak, the size of the crystal was determined to be 16 nm. ICP analysis revealed that the content of gold was 75 wt %.

(2) Polymerization of Polyaniline

Polyaniline (PANi) was synthesized using an oxidative polymerization method as follows. 9.38 g (0.10 mol) of aniline (obtained by distilling commercially available aniline under reduced pressure) was mixed with 100 mL of 1 M hydrochloric acid in an ice bath for 3 hours. Thereafter, 100 mL of an aqueous solution having 28.53 g (0.125 mol) ammonium persulfate dissolved therein was added drop wise to the mixed solution while stirring at −8° C. over 5 hours. Stirring was continued at −8° C. for 15 hours, and the obtained precipitate was recovered. The precipitate was washed, rinsed with aqueous ammonia, washed again and then dried to obtain PANi at a yield of 84.9%. The weight average molecular weight of the obtained PANi was $6.7 \times 10^4$ amu, and the polydispersity was 1.3. UV-Vis spectroscopy confirmed that the PANi had an emeraldine structure.

(3) Combining p-ATP-Coated Gold Nanoparticles and Electrically Conductive PANi 248.3 mg of PANi, synthesized as above, and 290 mg of camphorsulfonic acid (CSA) were mixed in an agate mortar. A solution obtained by dispersing 1.7 mg of p-ATP-coated gold nanoparticle in 1.25 g of m-cresol was added to the mixture and mixed. 23.55 g of m-cresol was then added and thoroughly mixed. At this point, the content of gold based on PANi was 0.5 wt %.

The solution was coated on a glass substrate and dried to obtain a PANi film. The PANi film was cut into an appropriate size, a platinum wire with a diameter of 0.1 mm was connected, and the electrical conductivity was measured using a four-terminal method. An electrically conductive paste, XC-32 (Fujikura Kasei Co., Ltd., Tokyo, Japan) was used for the electrical connection. The Seebeck coefficient of the PANi film (separated from the glass substrate) was measured using a Mobile Seebeck device (ai-Phase Co., Ltd., Tokyo, Japan). The results are shown in Table 1.

Example 2 and Example 3

A p-ATP-coated gold nanoparticle obtained as detailed in Example 1 was combined with electrically conductive PANi as detailed in Example 1 except that the gold content based on PANi was changed to 1.1 wt % (Example 2) or 2.1 wt % (Example 3). The electric conductivity and Seebeck coefficient were measured as detailed in Example 1, and the results are shown in Table 1.

Example 4

A p-ATP-coated gold nanoparticle was synthesized as detailed in Example 1 except that the mole ratio of p-ATP to gold ion ($Au^{3+}$) in the solution before reduction of the gold ion was 5:1. X-ray diffraction measurements of the p-ATP-coated gold nanoparticles obtained showed a peak attributable to crystalline gold. From the shape of the peak, it was determined that the size of the crystal was 2.5 nm. ICP analysis revealed that the content of gold was 69 wt %. This p-ATP-coated gold nanoparticle was combined with electrically conductive PANi as detailed in Example 1. The electric conductivity and Seebeck coefficient were measured as detailed in Example 1, and the results are shown in Table 1.

Example 5

A p-ATP-coated gold nanoparticle obtained as detailed in Example 4 was combined with electrically conductive PANi as detailed in Example 1 except that the gold content based on PANi was 1.0 wt %. The electric conductivity and Seebeck coefficient were measured as detailed in Example 1, and the results are shown in Table 1.

Comparative Example 1

Performance Evaluation of Electrically Conductive Polymer PANi Alone

PANi (250 mg) obtained as detailed in Example 1 and 290 mg of CSA were mixed in an agar mortar, and 24.8 g of m-cresol was added thereto and mixed thoroughly. This solution was coated on a glass substrate and dried to obtain a PANi film. The electric conductivity and Seebeck coefficient were measured as detailed in Example 1, and the results are shown in Tables 1, 2 and 4.

Comparative Example 2

Metal Nanoparticle-PANi Composite Using Aniline Moiety-Free Protective Agent A gold nanoparticle having polyvinylpyrrolidone (PVP) as a protective agent was synthesized as follows. A 1.0 mM ethanol/water (volume ratio=2:8) solution of PVP K30 was prepared. To this solution, tetrachloroauric(III) acid tetrahydrate was added to give a tetrachloroauric(III) acid concentration of 1.0 mM. The solution had a mole ratio of PVP to gold ion ($Au^{3+}$) of 1:1. The solution was stirred in a nitrogen atmosphere and was shielded from the light. The solution was then heated to 80° C. to create a reflux state. A 0.1 M sodium hydroxide solution was added drop wise so that the sodium hydroxide molar amount was four (4) times that of the gold ion ($Au^{3+}$). Immediately after the drop wise addition, the solution turned reddish black. This solution was dried, washed with water and dried again to obtain a black powder. X-ray diffraction measurements of the black powder showed a peak attributable to crystalline gold. From the shape of the peak, the size of the crystal was found to be 4.9 nm. ICP analysis revealed that the content of gold was 77 wt %.

The PVP-coated gold nanoparticle was combined with electrically conductive PANi as detailed in Example 1 except that the gold content based on PANi was 2.0 wt %. The electric conductivity and Seebeck coefficient were measured as detailed in Example 1, and the results are shown in Tables 1 and 4.

TABLE 1

|  | Example | | | | | Comparative Example | |
|---|---|---|---|---|---|---|---|
|  | 1 | 2 | 3 | 4 | 5 | 1 | 2 |
| Protective Agent:Gold (Mole ratio) | 1:1 | 1:1 | 1:1 | 5:1 | 5:1 | — | 1:1 |
| Gold content in PANi (wt %) | 0.5 | 1.1 | 2.1 | 0.5 | 1.0 | 0 | 2.0 |
| Electric conductivity (S/cm) | 337 | 338 | 356 | 382 | 369 | 191 | 219 |
| Seebeck coefficient (μV/K) | 13.2 | 13.6 | 12.9 | 13.0 | 13.4 | 13.4 | 11.8 |

Example 6

A p-ATP-coated gold nanoparticle was synthesized as detailed in Example 1 except that the mole ratio of p-ATP to gold ion ($Au^{3+}$) before reduction of the gold ion was 20:1. X-ray diffraction measurements of the obtained p-ATP-coated gold nanoparticle showed a peak attributable to crystalline gold. From the shape of the peak, the size of the crystal was found to be 2.6 nm. ICP analysis revealed that the content of gold was 8.2 wt %. The p-ATP-coated gold nanoparticles were combined with electrically conductive PANi as detailed in Example 1 except that the gold content based on PANi was 0.3 wt %. The electric conductivity was measured as detailed in Example 1 and is shown in Table 2.

Example 7

A p-ATP-coated gold nanoparticle obtained as detailed in Example 6 was combined with PANi during polymerization of the PANi as follows. 3.137 g ($3.4 \times 10^{-2}$ mol) of aniline (obtained by distilling commercially available aniline under reduced pressure) and 0.383 g of the p-ATP-coated gold nanoparticles were mixed. The mixture was added to 43 mL of 1 M hydrochloric acid with 9.0 g of LiCl dissolved therein and mixed at −10° C. for 3 hours. Thereafter, 41 mL of an aqueous solution having 11.53 g ($5.1 \times 10^{-2}$ mol) of ammonium persulfate dissolved therein was added drop wise to the solution under stirring at −10° C. over 30 minutes. Stirring was continued at −10° C. for 24 hours, and the obtained precipitate was recovered. The precipitate was washed, rinsed with aqueous ammonia, washed again and then dried to obtain PANi at a yield of 95.5%. ICP analysis revealed that the content of gold in the obtained PANi was 0.3 wt %.

Next 250 mg of the p-ATP-coated gold nanoparticle-PANi mixture and 290 mg of CSA were mixed in an agar mortar. 24.8 g of m-cresol was added and the mixture was mixed thoroughly. This solution was coated on a glass substrate and dried to obtain a PANi film. The electric conductivity was measured as detailed in Example 1 and is shown in Table 2.

TABLE 2

|  | Example 6 | Example 7 | Comparative Example 1 |
|---|---|---|---|
| Protective Agent:Gold (Mole ratio) | 20:1 | 20:1 | — |
| Gold content in PANi (wt %) | 0.3 | 0.3 | 0 |
| Electric conductivity (S/cm) | 243 | 303 | 191 |

Example 8

An aniline moiety-containing Polymer Protective Agent P(VP-ANi) having the structure given below was synthesized as follows.

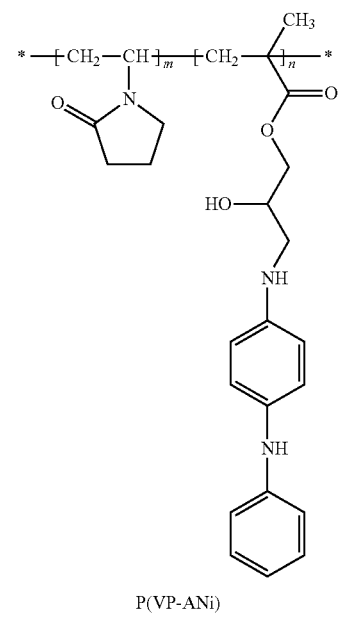

P(VP-ANi)

30.4 g of N-vinylpyrrolidone (NVP, Nippon Shokubai Co., Ltd., Osaka, Japan) and 1.60 g of N-phenyl-N'-(3-methacryloyloxy-2-hydroxypropyl)-p-phenylenediamine (NOCRAC G-1, Ouchi Shinko Chemical Industrial Co., Ltd., Tokyo, Japan) were charged into a 200 mL glass-made reaction vessel equipped with a stirrer, a condenser and a nitrogen inlet tube. 48 g of 1,3-dioxolan (DOL, Osaka Organic Chemical Industry Ltd., Osaka City, Japan) was then added and dissolved. The atmosphere of the solution was purged with nitrogen and then the solution was heated, with stirring, to a solution temperature of 65° C. 0.32 g of dimethyl 2,2'-azobis (2-methylpropionate) (V-601) was then added as a polymerization initiator, and the reaction was allowed to proceed for 20 hours. The reaction solution was then added drop wise into a large excess of acetone, and the precipitate was recovered. By $^{13}$C-NMR measurements, production of a copolymer was confirmed, and the copolymerization ratio of vinylpyrrolidone in the copolymer was found to be 93.5 mol %. Other copolymers differing in the copolymerization ratio were polymerized using the same method. The charge mass ratio and the solvent used in the polymerizations are shown in Table 3.

TABLE 3

| Charge Mass Ratio (NPV/G-1) | NVP (g) | G-1 (g) | V-601 (g) | Solvent Used |
|---|---|---|---|---|
| 95/5 | 30.4 | 1.6 | 0.32 | DOL |
| 90/10 | 28.8 | 3.2 | 0.32 | DOL |
| 75/25 | 24 | 8 | 0.32 | methanol |
| 50/50 | 50 | 50 | 0.32 | methanol |

Example 9

A P(VP-ANi)-coated gold nanoparticle was synthesized as detailed in Comparative Example 2 except that the P(VP-ANi) was synthesized with a mass ratio of NPV/G-1 of 95/5 and the mole ratio of P(VP-ANi) to gold ion ($Au^{3+}$) in the solution before reduction of the gold ion was 0.1:1. X-ray diffraction measurements of the obtained P(VP-ANi)-coated gold nanoparticle showed a peak attributable to crystalline gold. From the shape of the peak, the size of the crystal was found to be 11.3 nm. ICP analysis revealed that the content of gold was 98.7 wt %. This P(VP-ANi)-coated gold nanoparticle was combined with electrically conductive PANi as detailed in Example 1 except that the gold content based on PANi was 1.1 wt %. The electric conductivity and Seebeck coefficient were measured as detailed in Example 1, and the results are shown in Table 4.

Examples 10 to 13

A P(VP-ANi)-coated gold nanoparticle obtained as detailed in Example 9 was combined with electrically conductive PANi as detailed in Example 1 except that the gold content based on PANi was changed as shown in Table 4. The electric conductivity and Seebeck coefficients were measured as detailed in Example 1, and the results are shown in Table 4.

Example 14

A P(VP-ANi)-coated gold nanoparticle was synthesized as detailed in Example 9 except that the mole ratio of P(VP-ANi) to gold ion ($Au^{3+}$) in the solution before reduction of the gold ion was 1:1. X-ray diffraction measurements of the obtained P(VP-ANi)-coated gold nanoparticle showed a peak attributable to crystalline gold. From the shape of the peak, the size of the crystal was found to be 6.9 nm. ICP analysis revealed that the content of gold was 76.0 wt %. This P(VP-ANi)-coated gold nanoparticle was combined with electrically conductive PANi as detailed in Example 1 except that the gold content based on PANi was 1.9 wt %. The electric conductivity and Seebeck coefficient were measured as detailed in Example 1 and are shown in Table 4.

Example 15

A P(VP-ANi)-coated gold nanoparticle obtained as detailed in Example 14 was combined with electrically conductive PANi as detailed in Example 1 except that the gold content based on PANi was 5.6 wt %. The electric conductivity and Seebeck coefficient were measured as detailed in Example 1 and are shown in Table 4.

Example 16

A P(VP-ANi)-coated gold nanoparticle obtained as detailed in Example 14 was combined by mixing the P(VP-ANi)-coated nanoparticle during the polymerization of polyaniline as detailed in Example 7 except that the gold content based on PANi was 1.6 wt %. The electric conductivity and Seebeck coefficient were measured as detailed in Example 1, and the results are shown in Table 4.

Comparative Example 3

Metal Nanoparticle-PANi Composite Using Aniline Moiety-Free Protective Agent

A PVP-coated gold nanoparticle synthesized as detailed in Comparative Example 2 was combined with electrically conductive PANi as detailed in Comparative Example 2 except that the gold content based on PANi was 9.9 wt %. The electric conductivity and Seebeck coefficient were measured as detailed in Example 1, and the results are shown in Table 4.

TABLE 4

| | Example | | | | | | | | Comparative Example | | |
|---|---|---|---|---|---|---|---|---|---|---|---|
| | 9 | 10 | 11 | 12 | 13 | 14 | 15 | 16 | 1 | 2 | 3 |
| Protective agent:gold (Mole ratio) | 0.1:1 | 0.1:1 | 0.1:1 | 0.1:1 | 0.1:1 | 1:1 | 1:1 | 1:1 | — | 1:1 | 1:1 |
| Gold content based on wt of PANi (%) | 1.1 | 2.1 | 4.0 | 6.0 | 10.1 | 1.9 | 5.6 | 1.6 | 0 | 2.0 | 9.9 |
| Electric conductivity (S/cm) | 364 | 346 | 365 | 350 | 338 | 313 | 285 | 241 | 191 | 219 | 230 |
| Seebeck coefficient (μV/K) | 13.0 | 13.7 | 13.6 | 13.6 | 13.3 | 13.5 | 12.1 | 12.7 | 13.4 | 11.8 | 11.9 |

Example 17

A thermoelectric device was produced as follows by using CSA-doped PANi as an electrically conductive polymer.

PANi was produced as detailed in Example 1. 0.25 g of PANi and 0.29 g of CSA were mixed in an agate mortar, and 24.8 g of m-cresol was added thereto and mixed thoroughly. This solution was coated on a substrate (having a release treatment), dried and separated from the substrate to produce a PANi film having a thickness of 100 μm. The electric conductivity of the obtained PANi film was 191 S/cm, and the Seebeck coefficient was 13.4 μV/K (both were measured as detailed in Example 1).

The PANi film was cut into a strip of 1 mm (width)×20 mm (length), and adhered at intervals of 2 mm on the self-adhesive surface of a polyimide tape having a self-adhesive layer. The oblateness of the cross section of the PANi film was 10 (=1 mm/100 μm). This PANi film was combined with a copper wire having a diameter of 0.1 mm and a length of 20 mm to form a unit thermocouple. The connection of the PANi film and the copper wire, was accomplished with an electrically conductive paste (XC-32, Fujikura Kasei Co., Ltd., Tokyo, Japan). Ten pairs of unit thermocouples were formed on the polyimide film and connected in series to fabricate a thermoelectric device. The electric conductivity of copper is $6.0 \times 10^5$ S/cm, and the Seebeck coefficient is 1.8 μV/K.

A plurality of electrical connection portions arranged and aligned on one side of the thermoelectric device above were contacted as a hot junction with a heater, and power generation was performed at room temperature. When the hot junction temperature was 179° C., the temperature of another plurality of electrical connection portions, that is, the cold junction temperature, was 38° C., which was a sufficiently large temperature difference between the two junctions. The output voltage at this time was 10.0 mV.

Example 18

A solution of PANi obtained as detailed in Example 17 was coated on a polyimide film by screen printing. Eight square PANi patterns of 30 mm (width)×30 mm (length) having a film thickness of 12 μm were formed at intervals of 10 mm. The electric conductivity of this PANi pattern was 16.5 S/cm, and the Seebeck coefficient was 13.4 μV/K. The oblateness of the PANi pattern was 2,500 (=30 mm/12 μm). This PANi pattern was combined with a copper wire having a diameter of 0.1 mm and a length of 30 mm to form a unit thermocouple. The PANi pattern and copper wire were electrically connected using an electrically conductive paste, XC-32. Eight pairs of unit thermocouples were formed on the polyimide film. 64 sheets of this film were further stacked, forming 512 pairs of unit thermocouples, which were connected in series to fabricate a thermoelectric device. The electric conductivity of copper is $6.0 \times 10^5$ S/cm, and the Seebeck coefficient is 1.8 μV/K.

A plurality of electrical connection portions arranged on one side of the stacked thermoelectric device above were contacted as a hot junction with a heater, and power generation was performed at room temperature. When the hot junction temperature was 130° C., the temperature of another plurality of electrical connection portions, that is, the cold junction temperature, was 70° C., which was a sufficiently large temperature difference between the two junctions. The output voltage at this time was 0.14 V, and the output current was 2.1 μA.

Example 19

Polyaniline (Ormecon NX-C002NB, Nissan Chemicals Industries, Ltd., Tokyo, Japan) was coated on a polyimide film substrate and dried to obtain a 62 μm-thick polyaniline film. The electric conductivity of this polyaniline film was 150 S/cm, and the Seebeck coefficient was 13.4 μV/K. This film and the substrate were cut into a strip of 1 mm (width)×40 mm (length), and adhered at intervals of 2 mm on the self-adhesive surface of a polyimide tape having a self-adhesive layer. The thermal conductivity of the electrically conductive polyaniline has been reported to be from 0.02 to 0.24 W/(m·K) (27° C.) (see, H. Yan, et al., *J. Therm. Anal. Cal.*, 69, 881 (2002)).

A nickel foil (thickness: 20 μm) was cut into a strip of 1 mm (width)×40 mm (length) and placed between polyaniline strips on the self-adhesive surface of the polyimide tape. One end part of the polyaniline and one end part of the nickel foil were electrically connected using an electrically conductive paste (XC-32) to form a unit thermocouple. Ten pairs of unit thermocouples were provided on the polyimide film, and these unit thermocouples were connected in series to fabricate a thermoelectric device. The electric conductivity of nickel is $1.5 \times 10^5$ S/cm, the Seebeck coefficient is −23.2 μV/K (27° C.), and the thermal conductivity is 90.5 W/(m·K).

A plurality of electrical connection portions arranged on one side of the thermoelectric device above were contacted as a hot junction with a heater, and power generation was performed at room temperature. When the hot junction temperature was 105° C., the temperature of another plurality of electrical connection portions, that is, the cold junction temperature, was 25° C., which was nearly the same as room temperature, and was a sufficiently large temperature difference between the two junctions. The output voltage at this time was 20 mV.

The temperature distribution on the thermoelectric device surface was measured along the heat flow direction from the hot junction to the cold junction. At distances of 0 cm, 1 cm, 2 cm, 3 cm and 4 cm from the hot junction, the temperature on the thermoelectric device surface was 105° C., 48° C., 35° C., 29° C. and 25° C., respectively.

Example 20

A stacked thermoelectric device having the same structure as that in Example 18 having the p-ATP-coated metal nano-particle-electrically conductive PANi composite of Example 4 is theoretically examined.

From the experimental results of Example 18, the value of the device resistance can be calculated by dividing the output voltage by the output current to give a value of 66.7 kΩ (=0.14 V/2.1 μA). The resistance of the unit thermocouple calculated based on the electric conductivity of PANi used is 25.9 kΩ in total, and therefore, the contact resistance, between electrodes in the device can be estimated to be 40.8 kΩ in total. The calculation formulas used for the estimations are as follows.

Resistance of unit thermocouple = resistance of *PANi* + resistance of copper wire =

(1/electric conductivity of *PANi*(S/cm))·

(length(cm)/cross-sectional area(cm$^2$)) +

(1/electric conductivity of copper(*S*/cm))·

(length(cm)/cross-sectional area(cm$^2$)) =

$$(1/16.5) \times (3/3 \times 12 \times 10^{-4}) + (1/5.99 \times 10^5) \times (3/7.85 \times 10^{-5}) =$$

$$50.5 \, \Omega + 0.0638 \, \Omega = 50.6 \, \Omega$$

Total contact resistance in device = total resistance of device − total resistance of unit thermocouples

= 66.7 kΩ − 512(pairs) × 50.6 Ω

= 66.7 kΩ − 25.9 kΩ

= 40.8 kΩ

Using the results above, calculation when the material (PANi) used in Example 18 is replaced by the p-ATP-coated metal particle-PANi composite of Example 4 is performed. The preconditions for the calculation are as follows:

(i) the Seebeck coefficient does not change and in turn, the output voltage of the thermoelectric device does not change, (ii) the contact resistance in the thermoelectric device does not change, and (iii) the value of 382 S/cm in Example 4 is used as the electric conductivity of the p-ATP-coated metal nanoparticle-PANi composite.

The calculation results are as indicated below.

Resistance of unit thermocouple = resistance of composite + resistance of copper wire =

(1/electric conductivity of composite(S/cm)) ·

(length(cm)/cross-sectional area(cm$^2$)) +

(1/electric conductivity of copper($S$/cm)) ·

(length(cm)/cross-sectional area(cm$^2$)) =

$$(1/382) \times (3/3 \times 12 \times 10^{-4}) + (1/5.99 \times 10^5) \times (3/7.85 \times 10^{-5}) =$$

$$2.18 \, \Omega + 0.0638 \, \Omega = 2.24 \, \Omega$$

Total resistance of unit thermocouples = 512(pairs) × 2.24 Ω

= 1.15 kΩ

Device resistance = total resistance of unit thermocouples + contact resistance

= 1.15 kΩ + 40.8 kΩ

= about 42.0 kΩ

Output current = 140 mV/42.0 kQ

= 3.3 μA

It is therefore predicted that when the metal nanoparticle-electrically conductive composite material of Example 4 is used for the stacked thermoelectric device of Example 18, the output current becomes about 1.6 times (3.3 μA/2.1 μA) larger.

We claim:

1. A thermoelectric device comprising:
   (a) a heat resistant substrate;
   (b) a first thermoelectric material comprising an electrically conductive material comprising an electrically conductive polymer and at least one metal nanoparticle coated with a protective agent, said protective agent comprising a first part that has at least part of a molecular backbone of said electrically conductive polymer and a second part that interacts with said at least one metal nanoparticle, wherein the first thermoelectric material is disposed in a thin film on said substrate,
   (c) a second thermoelectric material comprising an n-type semiconductor or a metal, wherein the second thermoelectric material is disposed in a thin film or wire shape on said substrate, wherein the second thermoelectric material is adjacent to and spaced apart from said first thermoelectric material and wherein said first and second thermoelectric materials together constitute a unit thermocouple, and
   (d) an electrically conductive material that electrically connects an end part of said first thermoelectric material and an end part of said second thermoelectric material, thereby forming a circuit wherein said first thermoelectric material and said second thermoelectric material are alternately electrically connected in series and both ends of the circuit are opened.

2. The thermoelectric device according to claim 1, wherein said electrically conductive polymer is selected from polyaniline, polythiophene, polypyrrole, polyphenylenevinylene, polythienylenevinylene, and derivatives thereof.

3. The thermoelectric device according to claim 2, wherein said electrically conductive polymer comprises polyaniline, and said protective agent is selected from 4-aminothiophenol, 2-aminothiophenol, 3-aminothiophenol, 2-aminobenzenesulfonic acid, 2-aminobenzoic acid, 3-aminobenzoic acid, 4-aminobenzoic acid, 2-aminobenzonitrile, 3-aminobenzonitrile, 4-aminobenzonitrile, 2-aminobenzyl cyanide, 3-aminobenzyl cyanide, 4-aminobenzyl cyanide, N-phenyl-1,2-phenylenediamine, N-phenyl-1,4-phenylenediamine, or a copolymer of N-vinylpyrrolidone and N-phenyl-N'-(3-methacryloyloxy-2-hydroxypropyl)-p-phenylenediamine.

4. The thermoelectric device according to claim 2, wherein said electrically conductive polymer comprises polythiophene or polythienylenevinylene, and said protective agent is selected from 3-(2-thienyl)-DL-alanine, 4-(2-thienyl)butyric acid, 2-(2-thienyl)ethanol, 2-(3-thienyl)ethanol, 2-thiopheneacetic acid, 3-thiopheneacetic acid, 2-thiopheneacetonitrile, 2-thiophenecarbonitrile, 2-thiophenecarboxamide, 2-thiophenecarboxylic acid, 3-thiophenecarboxylic acid, 2-thiophenecarboxylic acid hydrazide, 2,5-thiophenedicarboxylic acid, 2-thiopheneethylamine, 2-thiopheneglyoxylic acid, 2-thiophenemalonic acid, 2-thiophenemethanol, or 3-thiophenemethanol.

5. The thermoelectric device according to claim 2, wherein said electrically conductive polymer comprises polypyrrole, and said protective agent is selected from pyrrole-2-carboxylic acid or 1-(2-cyanoethyl)pyrrole.

6. The thermoelectric device according to claim 2, wherein said electrically conductive polymer comprises polyphenylenevinylene, and said protective agent is selected from benzoic acid, benzenethiol, benzenesulfonic acid, 3-vinylbenzoic acid, or 4-vinylbenzoic acid.

7. The thermoelectric device according to claim 1, wherein said metal nanoparticle comprises gold, platinum, palladium, silver, rhodium, nickel, copper, tin, or an alloy thereof.

8. The thermoelectric device according to claim 1, wherein the mole ratio of said protective agent to said nanoparticles is from 0.1 to 50.

9. The thermoelectric device according to claim 1, wherein said metal nanoparticles are present in an amount of 0.01 wt % or more based on the weight of said electrically conductive polymer.

10. The thermoelectric device according to claim 1, wherein said electrically conductive polymer is polyaniline.

11. The thermoelectric device according to claim 1, wherein said substrate is flexible.

* * * * *